(12) United States Patent
Behboodian et al.

(10) Patent No.: US 7,221,301 B2
(45) Date of Patent: May 22, 2007

(54) METHOD AND SYSTEM FOR MITIGATING BACKGROUND NOISE FOR A SIGMA-DELTA DIGITAL-TO-ANALOG CONVERTER

(75) Inventors: Ali Behboodian, Natick, MA (US); Wayne W. Ballantyne, Coconut Creek, FL (US); Radu C. Frangopol, Plantation, FL (US); Audley F. Patterson, Miramar, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 11/216,292

(22) Filed: Aug. 31, 2005

(65) Prior Publication Data

US 2007/0046517 A1 Mar. 1, 2007

(51) Int. Cl.
*H03M 1/00* (2006.01)
(52) U.S. Cl. .................. 341/143; 341/131; 341/144
(58) Field of Classification Search ................ 341/131
See application file for complete search history.

(56) References Cited

U.S. PATENT DOCUMENTS

| | | | | |
|---|---|---|---|---|
| 4,937,576 A | * | 6/1990 | Yoshio et al. | 341/131 |
| 5,012,242 A | * | 4/1991 | Yoshio et al. | 341/131 |
| 5,144,308 A | * | 9/1992 | Norsworthy | 341/131 |
| 5,252,973 A | * | 10/1993 | Masuda | 341/131 |
| 6,064,328 A | * | 5/2000 | Scheidig et al. | 341/131 |
| 6,809,669 B1 | * | 10/2004 | Robinson | 341/131 |
| 2004/0233084 A1 | | 11/2004 | Brooks | |
| 2005/0038847 A1 | | 2/2005 | Cheng et al. | |

OTHER PUBLICATIONS

Steven R. Norsworthy, AT&T Bell Laboratories: "Effective Dithering of Sigma-Delta Modulators"; 0-7803-0593-0/92 IEEE 1992, pp. 1304-1307, unknown month.

Chris Dunn and Mark Sandler, Signal, Circuits and Systems Group: "Linearising Sigma-Delta Modulators Using Dither and Chaos"; 0-7803-2570-2/95 IEEE 1995, pp. 625-628, unknown month.

A.J. Magrath and M.B. Sandler: "Efficient Dithering of Sigma-Delta Modulators with Adaptive Bit Flipping"; Electronics Letters May 25, 1995, vol. 31 No. 11, pp. 846-847.

C. Dunn and M. Sandler: "Efficient Linearisation of Sigma-Delta Modulators Using Single-Bit Dither"; Electronics Letters Jun. 8, 1995, vol. 31 No. 12, pp. 941-942.

A.J. Magrath and M.B. Sandler: "Resolution Enhancement and Dither of Sigma-Delta Modulator Digital-to-Analogue Converters"; Electronics Letters Aug. 31, 1995, vol. 31 No. 18, pp. 1540-1542.

(Continued)

*Primary Examiner*—Khai M. Nguyen

(57) ABSTRACT

A sigma delta digital-to-analog (D/A) converter system (10) includes a summing device (35) at an input of a D/A converter (30), and a low frequency low amplitude wave signal (31) injected at an input of the summing device that remains unfiltered and is used to suppress spurious tone artifacts. The D/A converter system can further include an amplitude control and a frequency control for selectively adjusting the frequency and the amplitude of the low frequency low amplitude wave signal being injected. Note, the low frequency low amplitude repeating wave signal generator can take the form of a digital signal processor (DSP) (37) having the appropriate software to generate such signals.

18 Claims, 3 Drawing Sheets

OTHER PUBLICATIONS

Ichiro Fujimori, Akihiko Nogi and Testuro Sugimoto: "A Multibit Delta-Sigma Audio DAC with 120-dB Dynamic Range"; 0018-9200 IEEE 2000, pp. 1066-1073, unknown month.

Benoit Dufort and Gordon W. Roberts, Microelectronics and Computer Systems Laboratories, McGill University: "Optimized Periodic Sigma-Delta Bitstreams for Analog Signal Generation"; 1997 www.macs.ece.mcgill.ca/~roberts/ROBERTS/PUBLICATIONS/CONFERENCES/1997/midwest.97/Benoit_Dufort.pdf, site last visited Aug. 31, 2005, unknown month.

Gerardo Noriega, RMS Instruments: Technical Notes—DT3 "Sigma-Delta A/D Converters—Audio and Medium Bandwidths"; Feb. 1996, pp. 1-7, www.rmsinst.com/dt3. site last visited Aug. 31, 2005.

* cited by examiner

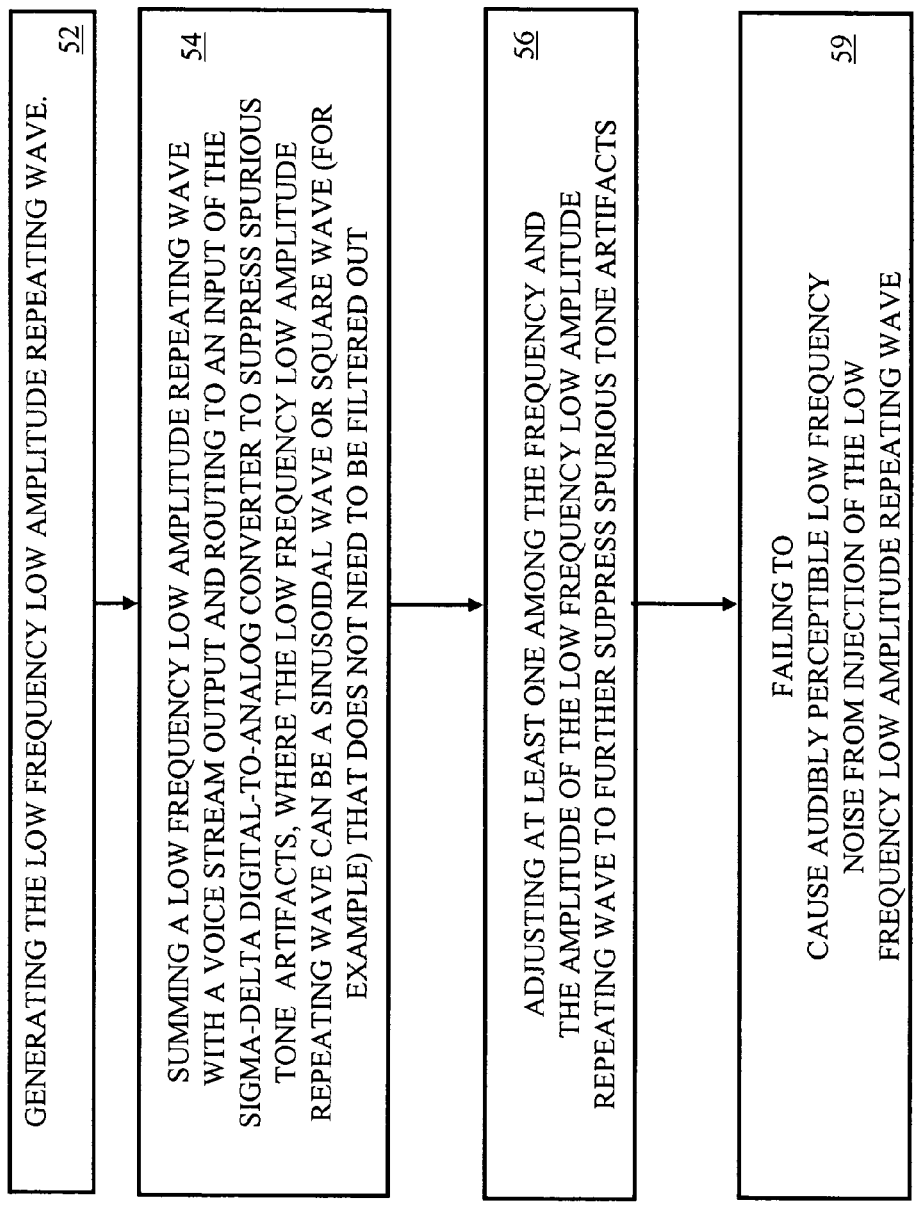

METHOD AND SYSTEM FOR MITIGATING BACKGROUND NOISE FOR A SIGMA-DELTA DIGITAL-TO-ANALOG CONVERTER

FIELD OF THE INVENTION

This invention relates generally to Sigma-Delta digital to analog converters, and more particularly to a method and system for mitigating spurious tone artifacts in such converter by injecting an out of band wave signal that goes unfiltered.

BACKGROUND OF THE INVENTION

Sigma-Delta based digital to analog converters (D/A) are mostly used to convert digital signals to analog signals for playback on the earpiece transducer or loudspeaker of a mobile phone. The advantage of these types of converters is that their over-sampling nature allows quantization noise to be reduced to lower levels than with other converters, as well as benefiting from integrated circuit (IC) lithography feature size reductions. These converters, in general, may produce a low-level background noise and other artifacts due to non-linear behaviors. This is the effect of limit cycle oscillations that results in the presence of periodic components in the output. These components may translate into low-level correlated audio tones, possibly random in amplitude that will be audible to the person using the phone, especially during periods of silence.

Attempts in the past to alleviate the problem described above, also known as spurious tone artifacts, have included dithering techniques or adding an out-of-band sine or square wave dither that would involve complicated generation of such dither as well as complicated filtering out of the dither. In one instance, dithering with pseudo-random white noise is effective if the dither signal is shaped according to the quantization noise transfer function of the modulator where the dither amplitude is intended to be relatively high.

SUMMARY OF THE INVENTION

Embodiments in accordance with the present invention can include a low-amplitude, low-frequency sinusoidal signal added to the input of a sigma-delta converter. The frequency of the sinusoidal signal can be so low (less than 50 Hz) that it can hardly be heard by the user.

In a first embodiment of the present invention, a method for mitigating background noise and spurious tone artifacts of a sigma-delta digital-to-analog converter can include injecting a low frequency low amplitude repeating wave at an input of the sigma-delta digital-to-analog converter to suppress spurious tone artifacts and adjusting at least one among several frequencies and the amplitude of the low frequency low amplitude repeating wave to further suppress spurious tone artifacts and improve perceived audio quality. Note, the low frequency low amplitude repeating wave can be user adjustable. The method can further include the step of generating the low frequency low amplitude repeating wave. The low frequency low amplitude repeating wave can be a sinusoidal wave or square wave, which does not need to be filtered out. In many audio receivers such as a cellular handset, the injection of the low frequency low amplitude repeating wave fails to produce an audibly perceptible low frequency noise or tone. The lack of an audibly perceptible low frequency noise in a cellular handset is due to the typically poor low frequency response found in cellular handset earpiece transducers in addition to a user's hearing being less sensitive to lower frequency tones.

In a second embodiment of the present invention, a sigma delta digital-to-analog converter system can include a summing device at an input of a sigma delta digital-to-analog converter, a digital audio source provided as an input to the summing device, and a low frequency low amplitude wave signal injected at an input of the summing device that can optionally remain unfiltered and is used to suppress spurious tone artifacts. The converter system can further include a low frequency low amplitude repeating wave signal generator coupled to an input of the summing device where the converter can further include an amplitude control and a frequency control for selectively adjusting the frequency and the amplitude of the low frequency low amplitude wave signal being injected.

In a third embodiment of the present invention, a sigma delta digital-to-analog converter system can include a programmable device for defining a sigma delta digital-to-analog converter including a summing device at an input of the sigma delta digital-to-analog converter, a digital audio source provided as an input to the summing device, and a generator for generating a low frequency low amplitude wave signal that is injected at an input of the summing device that is used to suppress spurious tone artifacts. The programmable device can use a digital signal processor. Note, the low frequency low amplitude wave signal can remain unfiltered as an output of the summing device as the summing device serves as an input to the sigma-delta digital-to-analog converter.

Other embodiments, when configured in accordance with the inventive arrangements disclosed herein, can include a system for performing and a machine readable storage for causing a machine to perform the various processes and methods disclosed herein.

BRIEF DESCRIPTION OF THE DRAWINGS

FIG. 3 is a flow chart illustrating how a single injected tone can practically eliminate noise in accordance with an embodiment of the present invention.

DETAILED DESCRIPTION OF THE DRAWINGS

Figure 1:
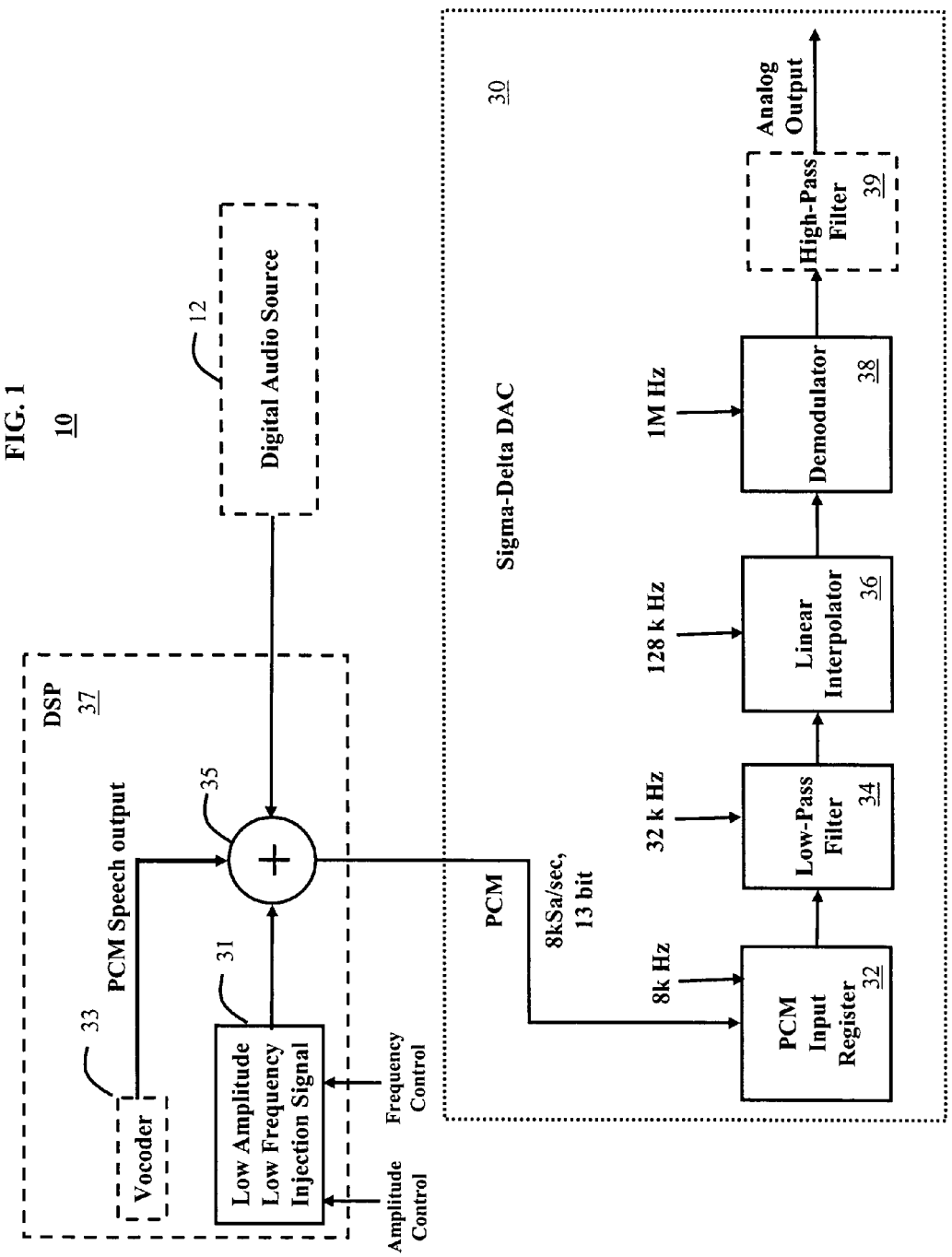
FIG. 1 is block diagram of an over-sampling delta-sigma data converter in accordance with an embodiment of the present invention.

While the specification concludes with claims defining the features of embodiments of the invention that are regarded as novel, it is believed that the invention will be better understood from a consideration of the following description in conjunction with the figures, in which like reference numerals are carried forward.

Sigma-delta D/A converters used for audio applications are known to generate potentially audible tone artifacts, especially during silent periods in a phone conversation where there are no other dominant input signals. Comfort noise generation is a method used in telephony in attempt to have a listener hear a smooth low-level noise in their earpiece, masking out low level tones. However, the sigma-delta tone artifacts described above are often louder than the comfort noise generated and hence is still perceivable by the user. More importantly, these tones have some frequency coherent aspects, making them more distinctive to a listener than would the equivalent noise of the same power magnitude. Attempts to solve the problem by adding a random noise to the input have failed to alleviate the sigma-delta tone artifacts problem described above.

In attempts to solve similar problems, dithering methods for masking audible tone artifacts in a sigma delta modulator have been used. Dithering involves intentionally adding in a low level random signal, such that the first or the first two least significant bits or bytes (LSBs) in this waveform are randomly set, and resultant signal is summed into the summer 35 in FIG. 1. This results in additional white noise added on top of the existent idle channel noise from the Sigma Delta D/A converter. (Idle channel noise exists for all types of sigma delta modulators, usually at a low enough level so as not to be objectionable.) For low level spurious artifacts, the injection of the dithered signal may mask out these artifacts without perceptibly raising the noise floor. If the spurious tone artifacts are large enough, however, it will be necessary to add in a larger amplitude dither waveform, and this may result in raising the overall noise floor to objectionable levels.

Embodiments in accordance with the present invention can generate a low-amplitude low-frequency sinusoidal signal that is added or injected to the input signal of the sigma-delta converter. The frequency of the sinusoidal signal is so low (less than 150 Hz or even less than 50 Hz) that it is hardly heard by the user. This is mostly because a power amplifier and a speaker or earpiece transducer used in conjunction with the sigma delta converter behave as high-pass filters and suppress the low-level sinusoidal signal before the speaker plays it back. In addition, the human ear also exhibits degraded sensitivity at lower audio frequencies. The amplitude of the sinusoidal signal can also be adjusted subjectively to achieve an optimum balance between spurious artifact suppression and audibility of the injected low frequency tone.

Figure 2:
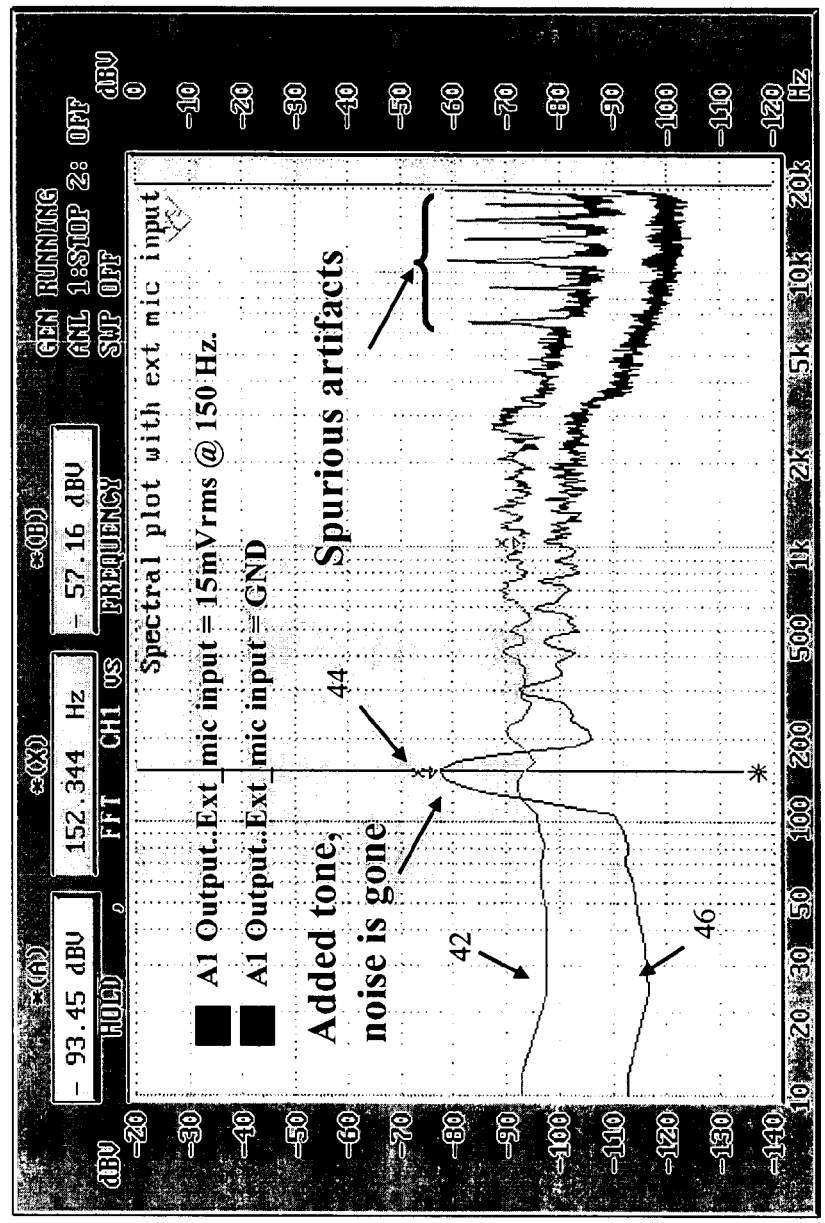
FIG. 2 is a chart illustrating signal power versus frequency, and showing the addition of a tone to remove noise in accordance with an embodiment of the present invention.

The low level noise due to non-linear oscillations in a D/A can be suppressed using an injection signal. Referring to FIG. 2, a chart 40 illustrates frequency versus power and further illustrates how the addition of a tone 44 removes noise and spurious tone artifacts in accordance with an embodiment of the present invention. A curve 42 shows the spectrum of a signal before the injection of the tone 44. Spurious tones are observed in the 8–20 kHz region of the spectrum. Such spurious tone can be random in amplitude, leading to a chinkling or "chandelier noise" characteristic. After the low frequency tone injection 44, a curve 46 illustrates that the spurious tone artifacts are significantly suppressed, and in fact the overall noise floor is also attenuated. The user barely, if at all, hears the energy due to the added sinusoidal component since the frequency is so low. Audible listening tests show that the perceived audio quality is improved by injecting a low frequency sine wave, since the spurious tone artifacts are suppressed. A simple table lookup algorithm can be used to generate a low-frequency low amplitude sinusoid in a DSP which can then be added to the signal in the D/A.

With reference to FIG. 1, details of an oversampling technique for D/A conversion is illustrated with an example of a digital-to-analog converter system 10 that includes an oversampling decoder 30 that processes 4 kHz telephone signals encoded into 16 bit words at 8 kHz. The input words are placed in a register 32 from which they are fed to a low pass filter 34 at 32 kHz. Each word can be repeated 4 times as part of the 8 to 32 kHz up-sampling process. The output of this filter resembles the PCM encoding of the signal at 32 kHz. The next stage is a linear interpolator 36 that inserts three new words between each pair of 32-kHz words, raising the rate to 128 kHz. These words are placed in a register from where they are fed to a demodulator 38 at 1 MHz. Each word is repeated eight times. The demodulation rounds off the code to 1-bit words with a feedback quantizer, converts them to analog form, and smoothes them with an analog filter. An optional high-pass filter 39 at the output of the decoder 30 can filter out any low frequency signal if desired. One reason the high pass filter 39 may be unnecessary as noted above can be due to the behavior of a power amplifier and a speaker or earpiece transducer used in conjunction with the sigma delta converter serving as high-pass filters and suppressing the low-level sinusoidal signal before the speaker plays the low-level sinusoidal signal back. The 1-MHz word rate is sufficiently high so that the quantization noise introduced into the signal is small, and the requirements of the analog smoothing filter are simple. The injection of a tone or a low amplitude low frequency injection signal 31 into a summation block 35 can eliminate or suppress any of the spurious tone artifacts at the output to the extent that they will not be humanly perceptible. This summation can most readily be implemented by a digital signal processor (DSP) 37 which will be generating the PCM voice audio stream using a vocoder 33. This audio stream is typically 13 or 16 bits per word, at a sample rate Fs=8 kHz. Alternatively, the summation block 35 can sum a separate digital audio source 12 (that can be stored in a memory or buffer external to the DSP 37) along with the low amplitude low frequency injection signal 31. Further note, in other embodiments the DSP 37 and audio sources can be replaced by hardware blocks such as an ADPCM and decompressor as well as hardware that can generate the low frequency and source audio.

Referring to FIG. 3, a flow chart illustrating a method 50 for mitigating background noise of a sigma-delta digital-to-analog converter is shown. The method 50 can include generating a low frequency low amplitude repeating wave at step 52 and summing the low frequency low amplitude repeating wave with a pulse code modulated (PCM) audio stream and routing to an input of the sigma-delta digital-to-analog converter to suppress spurious tone artifacts at step 54. The low frequency low amplitude repeating wave can be a sinusoidal wave or square wave for example and does not need to be filtered out. The method 50 can further include the step 56 of adjusting the frequencies or the amplitude of the low frequency low amplitude repeating wave to further suppress spurious tone artifacts. The adjustment can be performed in a factory setting on an individual unit basis, or preset for a class of handset models based on iterative engineering experimentation conducted in a controlled setting. Further note at step 59 that the injection of the low frequency low amplitude repeating wave fails to produce an audibly perceptible low frequency noise or tone. (Actually, part of the adjustment process criterion in step 56 is achievement of the optimum tone frequency/amplitude value that suppresses coherent tone artifacts from the Sigma Delta D/A converter, while minimizing the user perceptibility of the tone.)

In light of the foregoing description, it should be recognized that embodiments in accordance with the present invention can be realized in hardware, software, or a combination of hardware and software. A network or system according to the present invention can be realized in a centralized fashion in one computer system or processor, or in a distributed fashion where different elements are spread across several interconnected computer systems or processors (such as a microprocessor and a DSP). Any kind of computer system, or other apparatus adapted for carrying out the functions described herein, is suited. A typical combination of hardware and software could be a general purpose computer system with a computer program that, when being loaded and executed, controls the computer system such that it carries out the functions described herein.

In light of the foregoing description, it should also be recognized that embodiments in accordance with the present invention can be realized in numerous configurations contemplated to be within the scope and spirit of the claims. Additionally, the description above is intended by way of example only and is not intended to limit the present invention in any way, except as set forth in the following claims.

What is claimed is:

1. A method for mitigating background noise and spurious tone artifacts of a sigma-delta digital-to-analog converter, comprising the steps of:
    injecting a low frequency low amplitude repeating wave at an input of the sigma-delta digital-to-analog converter to suppress spurious tone artifacts;
    summing the low frequency low amplitude repeating wave with a pulse code modulated (PCM) audio stream forming pulse code modulated input words;
    adjusting several frequencies or the amplitude of the low frequency low amplitude repeating wave to further suppress spurious tone artifacts and improve perceived audio quality;
    placing the pulse code modulated input words into a register;
    low pass filtering the pulse code modulated input words; and
    interpolating the pulse code modulated input words.

2. The method of claim 1, wherein the low frequency low amplitude repeating wave is a sinusoidal wave or a square wave and the pulse code modulated input words are further demodulated.

3. The method of claim 1, wherein a frequency and amplitude of the low frequency low amplitude repeating wave is user adjustable.

4. The method of claim 1, wherein the low frequency low amplitude repeating wave is not filtered out in subsequent audio processing stages.

5. The method of claim 1, wherein injection of the low frequency low amplitude repeating wave fails to produce an audibly perceptible low frequency noise or tone.

6. The method of claim 1, wherein the method further comprises the step of generating the low frequency low amplitude repeating wave.

7. A sigma delta digital-to-analog converter system, comprising:
    a summing device at an input of a sigma delta digital-to-analog converter;
    a digital audio source provided as an input to the summing device;
    a low frequency low amplitude repeating wave signal injected at an input of the summing device used to suppress spurious tone artifacts and which remains unfiltered as an output of the summing device when the summing device serves as an input to the sigma delta digital-to-analog converter;
    a pulse code modulation input register coupled to the summing device;
    a low-pass filter coupled to the pulse code modulation input register; and
    a linear interpolater coupled to the low-pass filter.

8. The sigma delta digital-to-analog converter system of claim 7, wherein the low frequency low amplitude repeating wave signal is a sinusoidal wave or a square wave and the sigma digital-to-analog converter system further comprises a demodulator coupled to the linear interpolater.

9. The sigma delta digital-to-analog converter system of claim 7, wherein a frequency and an amplitude of the low frequency low amplitude repeating wave signal is user adjustable.

10. The sigma delta digital-to-analog converter system of claim 7, wherein the low frequency low amplitude repeating wave signal remains unfiltered in the sigma delta digital-to-analog converter.

11. The sigma delta digital-to-analog converter system of claim 7, wherein injection of the low frequency low amplitude repeating wave signal fails to produce an audibly perceptible low frequency noise or tone.

12. The sigma delta digital-to-analog converter system of claim 7, wherein the converter further comprises a low frequency low amplitude repeating wave signal generator coupled to an input of the summing device.

13. The sigma delta digital-to-analog converter system of claim 12, wherein the converter further comprises an amplitude control and a frequency control for selectively adjusting the frequency and the amplitude of the low frequency low amplitude wave signal being injected.

14. A sigma delta digital-to-analog converter system, comprising:
    a programmable device for defining a sigma delta digital-to-analog converter including a summing device at an input of the sigma delta digital-to-analog converter;
    a digital audio source provided as an input to the summing device;
    a generator for generating a low frequency low amplitude repeating wave signal that is injected at an input of the summing device that is used to suppress spurious tone artifacts;
    a pulse code modulation input register coupled to the summing device;
    a low-pass filter coupled to the pulse code modulation input register; and
    a linear interpolater coupled to the low-pass filter.

15. The sigma delta digital-to-analog converter system of claim 14, wherein the programmable device is a digital signal processor.

16. The sigma delta digital-to-analog converter system of claim 14, wherein the sigma delta digital-to-analog converter further comprises a demodulator coupled to the linear interpolater.

17. The delta digital-to-analog converter system of claim 14, wherein the sigma delta digital-to-analog converter further comprises a demodulator coupled to the low-pass filter.

18. The sigma delta digital-to-analog converter system of claim 14, wherein the low frequency low amplitude wave signal remains unfiltered.

* * * * *